US005788799A

United States Patent [19]
Steger et al.

[11] Patent Number: 5,788,799
[45] Date of Patent: Aug. 4, 1998

[54] APPARATUS AND METHOD FOR CLEANING OF SEMICONDUCTOR PROCESS CHAMBER SURFACES

[75] Inventors: Robert J. Steger, Cupertino; Fred C. Redeker, Fremont, both of Calif.

[73] Assignee: Applied Materials, Inc., Santa Clara, Calif.

[21] Appl. No.: 661,842

[22] Filed: Jun. 11, 1996

[51] Int. Cl.$^6$ ................................................ H01L 21/00
[52] U.S. Cl. .......................... 156/345; 134/1.1; 216/67; 438/730
[58] Field of Search ................ 156/345 V, 345 P, 156/345 C, 345 MW, 345 PT, 345 PH, 345 PC, 345 WH, 345 MC; 134/1.1, 1.2, 1.3, 31, 102.1; 204/298.31, 298.35; 118/723 R, 723 ME, 723 ER, 724, 725; 216/69, 67; 438/710, 727, 730

[56] References Cited

U.S. PATENT DOCUMENTS

| | | | |
|---|---|---|---|
| 4,960,488 | 10/1990 | Law et al. | 156/643 |
| 5,085,727 | 2/1992 | Steger | 156/345 |
| 5,089,441 | 2/1992 | Mosiehi | 437/225 |
| 5,174,858 | 12/1992 | Hwang et al. | 156/643 |
| 5,252,892 | 10/1993 | Koshiishi et al. | 315/111.81 |
| 5,366,585 | 11/1994 | Robertson et al. | 156/643 |
| 5,472,509 | 12/1995 | Hiroshi | 156/345 X |
| 5,552,124 | 9/1996 | Su | 156/345 |
| 5,578,131 | 11/1996 | Ye et al. | 156/345 X |
| 5,647,913 | 7/1997 | Blalock | 118/723 E |

FOREIGN PATENT DOCUMENTS

| | | |
|---|---|---|
| 9130822 | 4/1992 | European Pat. Off. |
| PCT/US94/05619 | 12/1994 | WIPO |

OTHER PUBLICATIONS

"Plasma polymerization of fluorocarbons in re capacitively coupled diode system", E. Kay and A. Dilks, J. Vac. Sci. Technol 18(1)Jan./Feb. 1981, pp. 1–11.

"Today's Plasma Etch Chemistries", Peter H. Singer, Associate Editor, Semiconductor International, Mar. 1988, pp. 68–73.

U.S. application No. 8,278,605, Law.

*Primary Examiner*—William Powell
*Attorney, Agent, or Firm*—Shirley L. Church

[57] ABSTRACT

In accordance with the present invention, a temperature-controlled ceramic liner or barrier is used adjacent to process chamber surfaces during a plasma-comprising process, with the liner or barrier temperature being set to reduce the formation of deposits upon or to aid in the removal of deposits from the liner surface during the processing of a semiconductor substrate within the process chamber. In the alternative, cleaning of the process chamber surface is carried out after the semiconductor substrate is removed from the chamber, and the liner or barrier temperature is set to assist in the removal of deposits from the liner or barrier surface. Deposits accumulate on some process chamber surfaces faster than on others. Since the rate of deposit formation or removal is temperature dependent, the temperature-controlled ceramic liner may be constructed to enable independent temperature settings at different locations within the liner. When multiple temperature-controllable barriers are used, each barrier may be set at a different temperature in proportion to the deposit formation reduction or removal requirements in the area of the process chamber protected by the particular barrier. In a preferred embodiment of the invention, the plasma used either during the semiconductor substrate processing or during a cleaning process after removal of the substrate from the process chamber is generated externally from the process chamber and is fed into the process chamber through a conduit. The conduit or at least the interior surface of the conduit which contacts the plasma is comprised of a halogen-containing material. The halogen used in the conduit material may be selected in consideration of the active species which is to be fed through the interior of the conduit.

35 Claims, 4 Drawing Sheets

APPARATUS AND METHOD FOR CLEANING OF SEMICONDUCTOR PROCESS CHAMBER SURFACES

BACKGROUND OF THE INVENTION

1. Field of the Invention

The present invention pertains to an apparatus and method for cleaning chemical vapor deposition (CVD), physical vapor deposition (PVD), and etch chamber surfaces. In particular, the apparatus provides for the application of heat to the surface which is to be cleaned. The heat may be applied during the CVD, PVD, or etch processing of substrates, during subsequent cleaning operations (with the substrate removed), or both. In a preferred embodiment of the invention, process chamber cleaning operations are carried out after substrate removal, using an externally generated active species which is brought in contact with the surface to be cleaned, with this surface raised to elevated temperatures in accordance with the apparatus and method described herein.

2. Brief Description of the Background Art

Semiconductor processing involves a number of different chemical and physical processes whereby minute integrated circuits are created on a substrate. The integrated circuits are constructed using multilayers of patterns of various materials. Layers of material are created by combinations of various processes, including chemical vapor deposition, physical vapor deposition, and epitaxial growth. Some of the layers are patterned using photoresist masks and wet and dry etching techniques. Patterns are created within layers by the implanting of dopants at particular locations. (The substrate upon which the integrated circuit is created may be silicon, gallium arsenide, glass, or any other appropriate material). Many of the processes carried out within semiconductor processing reactors leave deposits on the walls of the process chamber which accumulate and become the source of harmful particulate matter which must be prevented from contaminating the semiconductor devices as they are formed within the process chamber. As the dimension size of the semiconductor device has become ever smaller, the presence of particulate matter upon the surface of the semiconductor workpiece has become ever more critical.

Deposits can be removed from the walls of processing chambers, gas distribution plates and the like by dry cleaning using plasma-enhanced etching, or the processing chamber surfaces can be opened and wet cleaned manually. This latter procedure for removing contaminants from the processing chamber wall is very time consuming.

Descriptions of the interrelationship between plasma etching and plasma polymerization, with emphasis on the plasma-surface interactions leading to polymerization are presented in "Plasma Polymerization of Fluorocarbons in RF Capacitively Coupled Diode System" by E. Kay and A. Dilks, *J. Vac. Sci. Technol.* 18 (1) January, February 1981. Further description of the use of fluorine and chlorine containing gases in plasma etching is provided in "Today's Plasma Etch Chemistries", Peter H. Singer, Associate Editor, *Semiconductor International*, March 1988. These articles make it clear that the development of a successful etch chemistry requires a careful selection of input gas composition as well as careful control of the process variables, including gas flow rate, chamber pressure and temperature, plasma energy, and system configuration.

The deposits on plasma process chamber walls can be removed in a plasma either by ion bombardment or by chemical reaction. Chemical reaction is preferred, since this method typically provides a more gentle means of removing deposits, avoiding the ion bombardment of process chamber surfaces. The most preferred way to remove deposits using a chemical reaction is to convert the deposits to a volatile species which can be pumped from the process chamber. Thus, it is desired to provide a method of chemical reaction which either prevents the formation of initial deposits upon the process chamber surface or which converts the deposits on process chamber surfaces to volatile species which can be easily removed from the process chamber.

In the alternative, the process chamber surfaces have been lined with removable, disposable (or "out-of-chamber" cleanable) liners which intercept depositing materials before they reach the process chamber surfaces. For example, U. S. Pat. No. 5,366,585 to Robertson et al., issued Nov. 22, 1994, assigned to the assignee of the present invention, and hereby incorporated by reference, describes a method and apparatus for protecting conductive, typically metallic walls of a plasma process chamber from the accumulation of contaminants thereon and from reaction with a gas plasma. A ceramic barrier material, preferably of at least 0.005 inches (127 mm) thickness, is used adjacent the conductive portions of the reactor chamber and between the gas plasma and such conductive portions to be protected. The ceramic barrier material intercepts the deposit of contaminating compounds formed from the plasma which would otherwise deposit on the protected reactor chamber surfaces and thereby reduces a source of particulates. Further, the ceramic barrier material, which reduces the amount of deposit formation, also enables cleaning of the reactor chamber using an etch plasma generated from halogen-comprising gas without the etch plasma attacking protected metallic portions of the reactor or the electrostatic chuck used for holding an article (typically a semiconductor substrate) to be processed in a reaction chamber.

Preferably the ceramic barrier is in the form of a ceramic liner, where the liner comprises a material chosen from the group consisting of the oxides and fluorides of aluminum, magnesium, and tantalum. Most preferably, the liner is constructed from alumina.

U. S. Pat. No. 5,085,727 to R. J. Steger, issued Feb. 4, 1992, discloses an improved plasma etching apparatus comprising an etch chamber having inner metal surfaces coated with a conductive coating capable of protecting such inner metal surfaces from chemical attack by reactant gases such as halogen-containing gases used in the chamber during the plasma etching processes. In a preferred embodiment, a carbon coating at least about 0.2 micrometers in thickness is formed on the inner metal surfaces of the etch chamber by a plasma assisted CVD process using a gaseous source of carbon and either hydrogen or nitrogen or both. The conductive coating material is said to comprise a material selected from the group consisting of carbon, titanium nitride, indium stannate, silicon carbide, titanium carbide and tantalum carbide.

U. S. patent application, Ser. No. 08/278,605 of Law et al., filed Jul. 21, 1994, assigned to the assignee of the present invention, and hereby incorporated by reference, describes a deposition chamber cleaning technique which uses a remote excitation source. The remote excitation source is used outside of the process chamber to generate a reactive species which is then supplied to the process chamber to assist in dry cleaning of the process chamber. A second, excitation source inside the chamber can be used to sustain the long lived species and/or to further break down the gas which serves as the source of the active species. Since the remote excitation source is relied upon to generate the reactive species, the local excitation source may be operated at much lower power levels than are required in a conventional system.

The exterior excitation source described in the preferred embodiment is a microwave generator. However, any power source that is capable of activating the precursor gas can be used. For example, both the remote and local plasmas can employ DC, radio frequency (RF) and microwave (MW) based discharge techniques. If an RF power source is used, it can be either capacitively or inductively coupled to the inside of the process chamber. External activation of the reactive species can also be performed by a thermally based, gas break-down technique, a high intensity light source, or an X-ray source, to name just a few.

PCT Patent Application Ser. No. PCT/US94/05619 of Bensen et al., published on Dec. 22, 1994, discloses a microwave plasma reactor including a chamber for containing a gas to be energized into a plasma with microwave energy, an electrode having two surfaces within the chamber. A first surface of the electrode radiates microwave energy to form the plasma proximate the radiating surface, and a second surface of the electrode receives microwave energy from a wave guide of coaxial conductor, which energy is transferred to the first, radiating surface.

European Patent Application No. 91308222.8 of Donald K. Smith, published Apr. 15, 1992, describes a recirculating high velocity convective flow reactive system which is well suited to deposit large area diamond films. The system includes a reactor into which gas is introduced, a gas activation region in the reactor, and a device for supplying energy to the gas in the activation region. The system also includes an activated gas surface interaction region in the reactor, spaced from the activation region, for utilizing the activated gas, and a high velocity pump, for moving the activated gas from the activation region to the interaction region by convection, while it remains active.

In general, the reactive species used for cleaning semiconductor process chambers are selected from a wide range of options, including the commonly used halogens and halogen compounds. For example, the reactive gas may be chlorine, fluorine, or compounds thereof, e.g. $F_2$, $ClF_3$ $NF_3$, $CF_4$, $SF_6$, $C_2F_6$, $CCl_4$, and $C_2Cl_6$. Of course the particular gas that is used depends on the deposited material which is being removed. For example, in a tungsten deposition system, a fluorine compound gas is typically used to remove the deposited tungsten.

U. S. Pat. No. 4,960,488 to Law et al., issued Oct. 2, 1990, assigned to the assignee of the present invention, and hereby incorporated by reference, describes a process for cleaning a reactor chamber. The process is used to clean adjacent the RF electrodes and throughout the chamber and exhaust system.

The preferred embodiment describes the process parameters used in the deposition of silicon dioxide upon a semiconductor wafer substrate. In particular, TEOS, oxygen and a carrier gas are inlet into the process chamber at a pressure of 0.5 to 200 Torr. The wafer substrate is heated to about 375° C., the gas manifold plate is maintained at between about 35° C. (to prevent condensation of TEOS thereon) and about 75° C. (above which TEOS decomposes to a reactive species). The subsequent cleaning procedure is designed to remove residual reactants and silicon dioxide from the process chamber.

The cleaning procedure is a two step continuous etch sequence. In the first step, relatively high pressure (2–15 Torr), close electrode spacing (160 mils, i.e. 4.06 mm), fluorocarbon gas chemistry (a mixture of $C_2F_6$ and $O_2$ at a $C_2F_6$:$O_2$ flow ratio of about 1:1 at about 100 sccm) at an RF power of about 250–650 watts at 13.56 megahertz is used for etching the electrodes. In the second step, a lower pressure (500 milliTorr–1 Torr) is used, in combination with a greater electrode spacing (400 mils, i.e. 10.16 mm), fluorocarbon gas chemistry ($NF_3$ at 50–150 sccm), at an RF power of about 125–500 watts at 13.56 megahertz. No temperature ranges are provided for the cleaning procedure.

SUMMARY OF THE INVENTION

In accordance with the present invention, a temperature-controlled ceramic liner or barrier is used adjacent to process chamber surfaces during a plasma-comprising process, with the liner or barrier temperature being set to reduce the formation of deposits upon, or to aid in the removal of deposits from the liner surface during the processing of a semiconductor substrate within the process chamber. In the alternative, cleaning of the process chamber surface is carried out after the semiconductor substrate is removed from the chamber, and the liner or barrier temperature is set to assist in the removal of deposits from the liner or barrier surface.

Deposits accumulate on some process chamber surfaces faster than on others. Since the rate of deposit formation or removal is temperature dependent, the temperature-controlled ceramic liner may be constructed to enable independent temperature settings at different locations within the liner. When multiple temperature-controllable barriers are used, each barrier may be set at a different temperature in proportion to the deposit formation, reduction in formation, or removal requirements in the area of the process chamber protected by the particular barrier.

In a preferred embodiment of the invention, the plasma used either during the semiconductor substrate processing or during a cleaning process after removal of the substrate from the process chamber is generated externally from the process chamber and is fed into the process chamber through a conduit. When the plasma includes an activated halogen species, the conduit or at least the interior surface of the conduit which contacts the plasma is selected to comprise a halogen-containing material. The halogen used in the conduit material may be selected so that it contains the same element as the active species which is to be fed through the interior of the conduit.

DETAILED DESCRIPTION OF THE PREFERRED EMBODIMENTS

The present invention pertains to a temperature-controlled ceramic liner or barrier material which is used adjacent to process chamber surfaces during a plasma-comprising process. The temperature of the ceramic liner or barrier is set to reduce the formation of deposits upon or to aid in the removal of deposits from the liner surface during the processing of a semiconductor substrate within the process chamber. In the alternative, the liner temperature is set to assist in the removal of deposits from the liner surface during a plasma cleaning process conducted after removal of the semiconductor substrate from the process chamber.

The temperature-controlled liner is comprised of ceramic, which offers the particular advantage of being resistant to halocarbons at temperatures which may be as high as 900° C. In the majority of applications, the process temperature is less than about 400° C., and preferably the process temperature is about 350° C. or less. With regard to the reduction in formation of residues on process chamber walls during production of a semiconductor device, the ceramic liner temperature setting depends on the process chemistry of the CVD, PVD or etch process which is being carried out. When the ceramic liner assists in the cleaning of a reactor chamber after the semiconductor substrate has been removed, since the clean rate is typically exponential with temperature, the ceramic liner temperature setting will be as high as is practical, depending on the equipment involved. For example, the cleaning rate eventually becomes diffusion limited by the amount of halogen-containing plasma species which reaches the surface being cleaned.

Metals, glass, resins, and ceramics are frequently used in the chemical industry as reactor materials. Reactor surfaces which come in contact with halogens and halogen compounds must be designed for corrosion-resistance. The plasma-generated active halogen species used for reactor cleaning in the semiconductor industry are particularly corrosive. Although there are resins which will withstand these active halogen species, such resins are typically have a short performance life at temperatures greater than about 100° C.

Although metallic materials such as stainless steels and high nickel alloy steels exhibit sufficient corrosion resistance, materials containing iron even in a small amount pose a problem because the iron may cause surface defects on a silicon substrate in the presence of halogens, particularly fluorine. In general, we avoid the use of heavy metals for reactor surfaces when a sputtering process may be carried out within the reactor, since such heavy metals are readily transported to the semiconductor substrate (wafer) during the sputtering process. The familiar aluminum alloy reactor surfaces are not only attacked by corrosive, halogen-containing plasmas, they further contain various constituents which form particulates upon exposure to halogen-containing plasmas.

Glass-comprising materials, such as borosilicate glass, are etched rapidly in fluorine and are typically weak against heat shocks. In addition, many glasses are heavy in sodium, release of which endangers the stability of the aluminum surface of the reactor as well as the substrate being processed in the reactor.

The preferred material of construction for the temperature-adjustable liner is a ceramic material which is substantially free (typically less than about 10 ppm) from transition metals and alkalis. Such ceramic materials have demonstrated excellent corrosion resistance in the presence of halogen-containing plasmas.

The preferred ceramic material used to fabricate the liner is represented by the following formula:

$$N_a Y_b$$

wherein N includes boron, aluminum, silicon, titanium, zirconium or chromium. Y includes oxygen, nitrogen or carbon. Typically, a is an integer of 1–2 and b is an integer of 1–3. The ceramic material may also be a mixture of such materials.

Among the more preferred ceramic materials are oxides of alumina, silica, titania and zirconia, carbides such as silicon carbide, titanium carbide and zirconium carbide, and nitrides such as aluminum nitride, boron nitride, silicon nitride and titanium nitride. Of these materials, aluminum nitride has proved to be particularly compatible with semiconductor processing.

The ceramic temperature-adjustable liner or barrier preferably utilizes a resistance heater as the embedded heating element which is used to adjust the temperature of the liner. The preferred heating element is a resistance heater, for example (and not by way of limitation) a flexible etched foil heater or a wire-wound heating element. It is advantageous to select the material composition of the heating element so that the thermal expansion coefficient of the heating element matches to that of the liner or barrier ceramic. This increases the lifetime of the temperature-controlled ceramic liner or barrier and prevents cracking of the liner or barrier which can reduce protection of the process chamber surface behind the liner or barrier.

Heat must be extracted from the liner in general, since the liner will absorb heat during processing. Since it is desired to operate the various processes at temperatures greater than 100° C., water-containing cooling channels within the ceramic liner are not useful for extracting heat. Although there are some oils which can be used, this is not the preferred manner of removing heat. Preferably a thermal drop (conductive heat transfer means) which constantly draws heat out of the ceramic liner is used. The temperature of the liner is then controlled by offsetting the thermal drop heat loss using the embedded heating element and the plasma load. A thermocouple located upon or near the surface of the temperature-controlled ceramic liner or barrier detects the surface temperature and sends a signal to a controller, such as a commercially available SCR (silicon controlled rectifier) controller with a proportional integrating derivative (PID) loop which controls the power to the embedded resistance heating element. In the present preferred embodiment, the nozzles and conduits used to feed activated plasma species into the process chamber serve as thermal drops, as well as tubes which provide access for the heater leads to the liner, and other peripheral devices which lead from the process chamber to an exterior location. One skilled in the art can envision any number of conductive heat transfer devices. In some instances, an inert heat transfer gas may be circulated between the aluminum alloy interior surface of the process chamber and the back side of the liner, with the inert heat transfer gas being constantly withdrawn from the process chamber to maintain the reduced pressure inside the process chamber.

In a preferred embodiment of the invention, the plasma used either during the semiconductor substrate processing, or during a cleaning process after removal of the substrate from the process chamber, is generated externally from the process chamber and is fed into the process chamber through a conduit having at least its interior surface comprised of a halogen-containing material. In general, the conduit used to transfer the active plasma from an externally-generated source is operated at approximately room temperature. The halogen-containing material which comprises the conduit material is preferably selected in consideration of the active species which is to be fed through the interior of the conduit. Examples of materials useful for at least the interior surface of the conduit include materials which are generally suitable for chlorine or fluorine service, such as polytetrafluoroethylene (PTFE), polychlorotrifluoroethylene (PCTFE), perfluoroalkoxy (PFA), fluorinated ethylene propylene (FEP), ethylene-tetrafluoroethylene(ETFE), ethylene-chlorotrifluoroethylene(ECTFE), chlorinated polyvinylchloride (CPVC), polyvinylidine chloride (PVDC), polyvinylidine fluoride (PVDF) and the like.

The preferred embodiments described below are not intended to act as a limitation on the invention, but are used for illustrative purposes, as one skilled in the art can expand the concepts disclosed herein to the scope of the invention claimed herein.

EXAMPLES

It has been observed that the deposition rate for the silica coating in a $SiH_4$–$O_2$ plasma is temperature dependent such that increasing temperature (above that necessary to form the silicon dioxide) serves to reduce the deposition rate of the silica coating. Also, it has been observed that the rate of fluorine plasma cleaning of silica coatings from chamber walls is increased with an increase in the temperature of the surface from which the silica coating is to be removed. Thus, by controlling the temperature of a surface, it is possible to reduce deposition or prevent deposition, or to increase the decomposition rate and removal of a deposit from a surface.

In the present instance, it is desired to produce a silica coating on a semiconductor substrate surface while avoiding deposition of a silica coating on surrounding process chamber surfaces.

Figure 1:
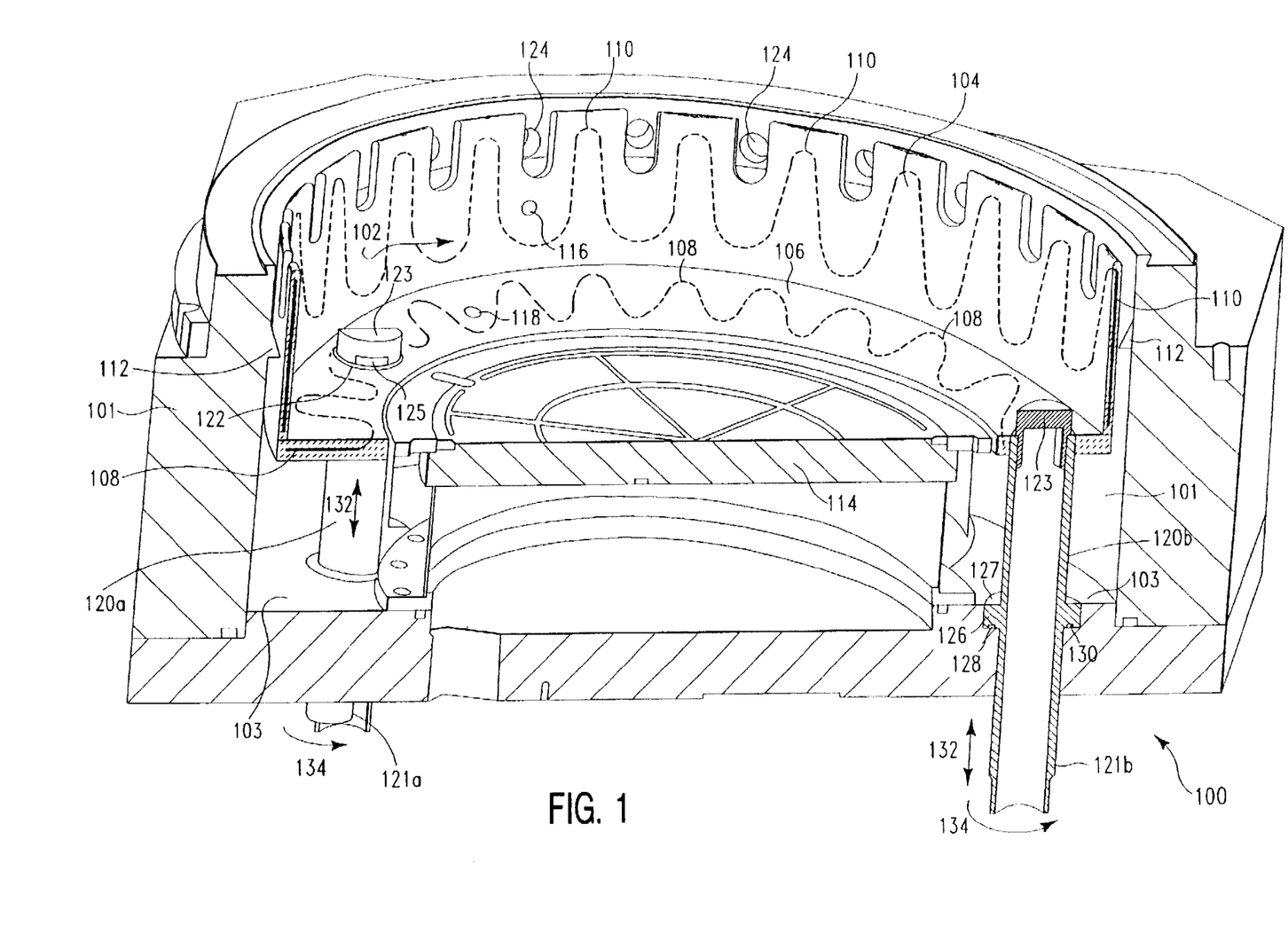
FIG. 1 illustrates a semiconductor plasma processing chamber with a temperature-controlled ceramic liner in place within the chamber.

FIG. 1 shows a schematic of a lower section of a semiconductor process chamber 100 of the kind in which plasma-assisted chemical vapor deposition of coatings is carried out. The process chamber 100 includes an electrostatic chuck/susceptor 114 on which a semiconductor substrate (not shown) is held during processing. The process chamber walls 101 are subject to the deposition of coatings generated by the chemical vapor deposition. In addition, since process chamber walls 101 are generally constructed from an aluminum alloy, the alloy may react with many of the active species generated in plasma-assisted processing. To protect the aluminum alloy walls 101 of the process chamber from being coated by chemical vapor deposition materials, sputtered materials, etc., a temperature-controlled ceramic liner 102 is used. In the present illustration, temperature-controlled ceramic liner 102 is made up of two sections, an upper section 104 and a lower section 106. Upper section 104 contains an embedded resistance heater 110 and lower section 106 contains an embedded resistance heater 108. Upper section 104 also contains a thermocouple 116 which enables detection of the temperature of upper section 104, while lower section 106 contains a thermocouple 118 which enables detection of the temperature of lower section 106. Each thermocouple, 116 and 118, is connected to a controller (not shown) such as a commercially available SCR (silicon controlled rectifier) controller with a proportional integrating derivative (PID) loop. The controller for upper section 104 of ceramic liner 102 is used to control the temperature of that section, while the controller for the lower section 106 of ceramic liner 102 is used to control the temperature of that section of the ceramic liner 102 independently. This makes it possible to operate each section of ceramic liner 102 at the temperature which provides the desired reduction in coating deposition during chemical vapor deposition or sputter processing. Further, although the temperature-controlled ceramic liner 102 does not completely isolate the aluminum alloy wall surfaces of the reactor from plasma-assisted processes, it reduces contact of the process chamber wall surfaces with the corrosive plasmas, while acting as a partial barrier between a substrate being processed interior to the liner and particulates which are forming on process chamber wall surfaces. In addition, after removal of the substrate from the process chamber, the removal rate from a given section of liner can be controlled during cleaning operations for removal of coated or sputtered materials from the liner.

With regard to reducing or preventing the accumulation of silica and other deposits on process chamber surfaces during processing of a semiconductor substrate, the following example applies.

During plasma-assisted chemical vapor deposition of a silicon oxide coating on the surface of a semiconductor substrate, when the deposit rate of silica on the surface of lower section 106 of temperature-controlled ceramic liner 102 is slower than the deposit rate on the surface of upper section 104, the temperature of lower section 106 is set lower than the temperature of upper section 104.

For example, a typical silicon oxide coating was applied in a HDP CVD Centura® Reactor, available from Applied Materials, Inc. of Santa Clara, Calif. The process conditions for the plasma-assisted chemical vapor deposition included an RF generated plasma at 2.0 MHz and approximately 2500 W, employing a pressure of about 0.01 to about 100 mTorr, and a self-bias voltage of about 0 to about 500 V. The gas flow rates were approximately 50 sccm $SiH_4$, 100 sccm of $O_2$, in combination with a carrier gas flow rate of about 100 sccm of Ar or Kr, with the surface temperature of the semiconductor substrate being at about 200° C. to about 400° C.

The temperature of the lower section 106 of a temperature-controlled ceramic liner 102 placed within process chamber 100, as shown in FIG. 1, was set at about 150° C., while the temperature of upper section 104 was set at about 120° C. Without the presence of the temperature-controlled liner 102, the expected build up of silica on the lower aluminum surface 103 of process chamber 100 typically ranged between about 4,000 Angstroms and about 6,000 Angstroms per processing of 4×8,000 Angstrom 8 in. diameter silicon wafers. With the temperature-controlled liner 102 in place and with the sections of the liner set at the temperatures specified above, the expected build up of silica on the lower aluminum surface 103, under the same deposition conditions, is typically less than about 3,000 Angstroms.

Upper section 104 of ceramic liner 102 may be cemented to or brazed to (not shown) lower section 106 of ceramic liner 102.

Figure 2:
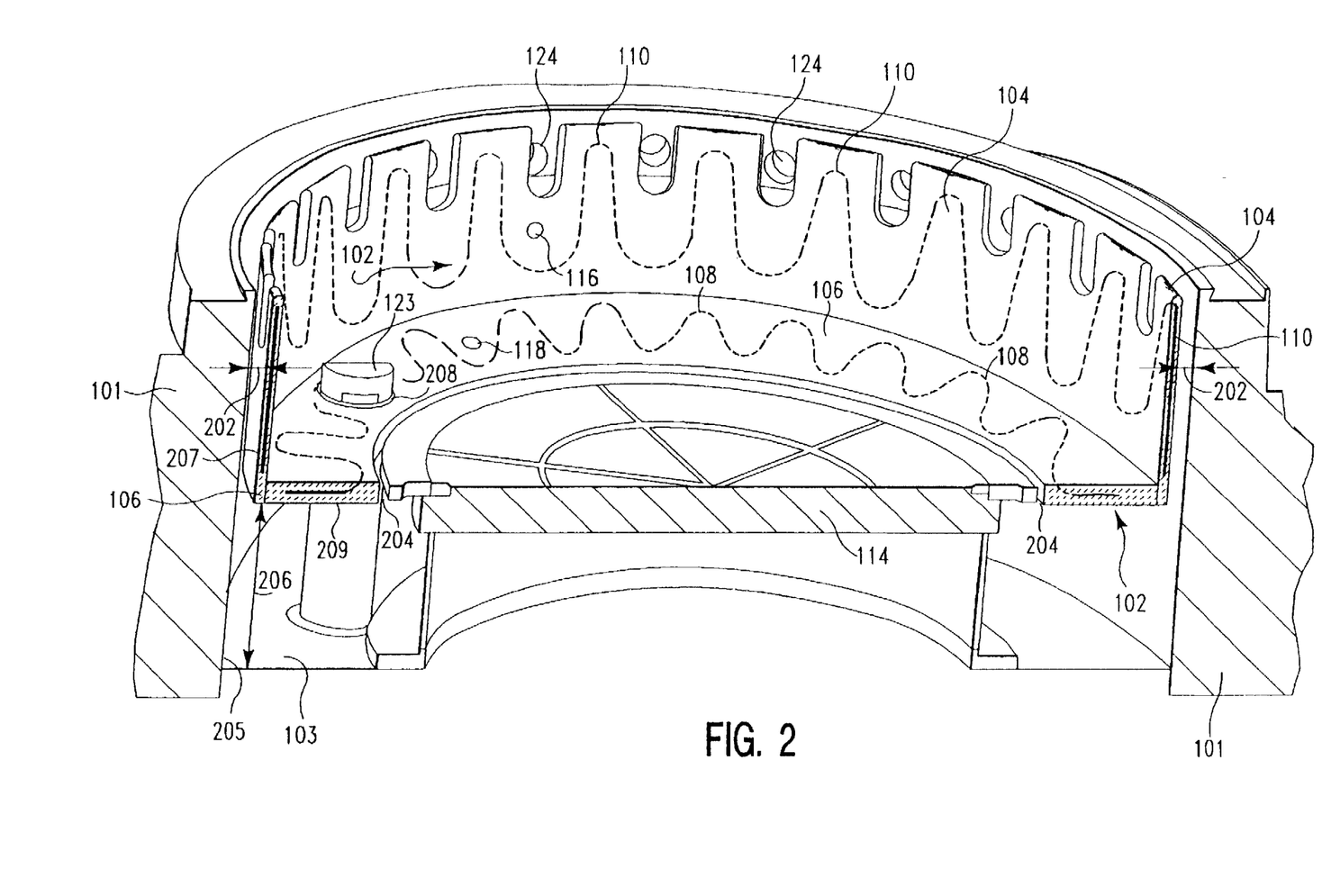
FIG. 2 shows a schematic of a the plasma processing chamber of FIG. 1 with emphasis on the temperature-controlled ceramic liner and its spacing from the temperature-conductive walls of the processing chamber.

Depending on the temperature difference between the temperature-controlled ceramic liner or barrier and the process chamber surface it protects, it may be advisable to leave a space between the liner or barrier and the process chamber surface. Typically, temperature-controlled ceramic liner 102 would be placed such that the spacing between the liner and face of the aluminum alloy process chamber walls is about 0.5 mm. However, any spacing between the liner and the process chamber walls which avoids intimate contact is generally adequate at the reduced pressures used for plasma processing and at temperatures below about 300° C. For example, with reference to FIG. 2, an insulating space 202 of about 0.5 mm (not to scale) between process chamber aluminum wall 101 surface 205 and the back surface 207 of the upper section 104 of temperature-controlled ceramic liner 102 is adequate. FIG. 2 also shows a space 206 between lower aluminum surface 103 and the lower surface 209 of the lower section 106 of temperature-controlled ceramic liner 102. Additional spacing such as 204 between electrostatic chuck 114 and the lower section 106 of ceramic liner 102, and spacing 208 between nozzle 123 and the lower section 106 of ceramic liner 102 helps prevent heat transfer between these elements within the process chamber.

There are some instances where the element to be cleaned can be fabricated from a ceramic having an embedded heating element and the temperature of the element itself can be adjusted during a cleaning process to assist in the removal of deposits from the surface of the element. A good example of this is an electrostatic chuck fabricated from aluminum nitride and containing an embedded heating element. During a plasma-assisted cleaning process, the temperature of the electrostatic chuck can be adjusted to that which provides the optimum reactivity of the deposit to be removed.

With regard to cleaning of the semiconductor process chamber 100 after removal of the semiconductor substrate from the chamber, the following example applies.

Figure 3:
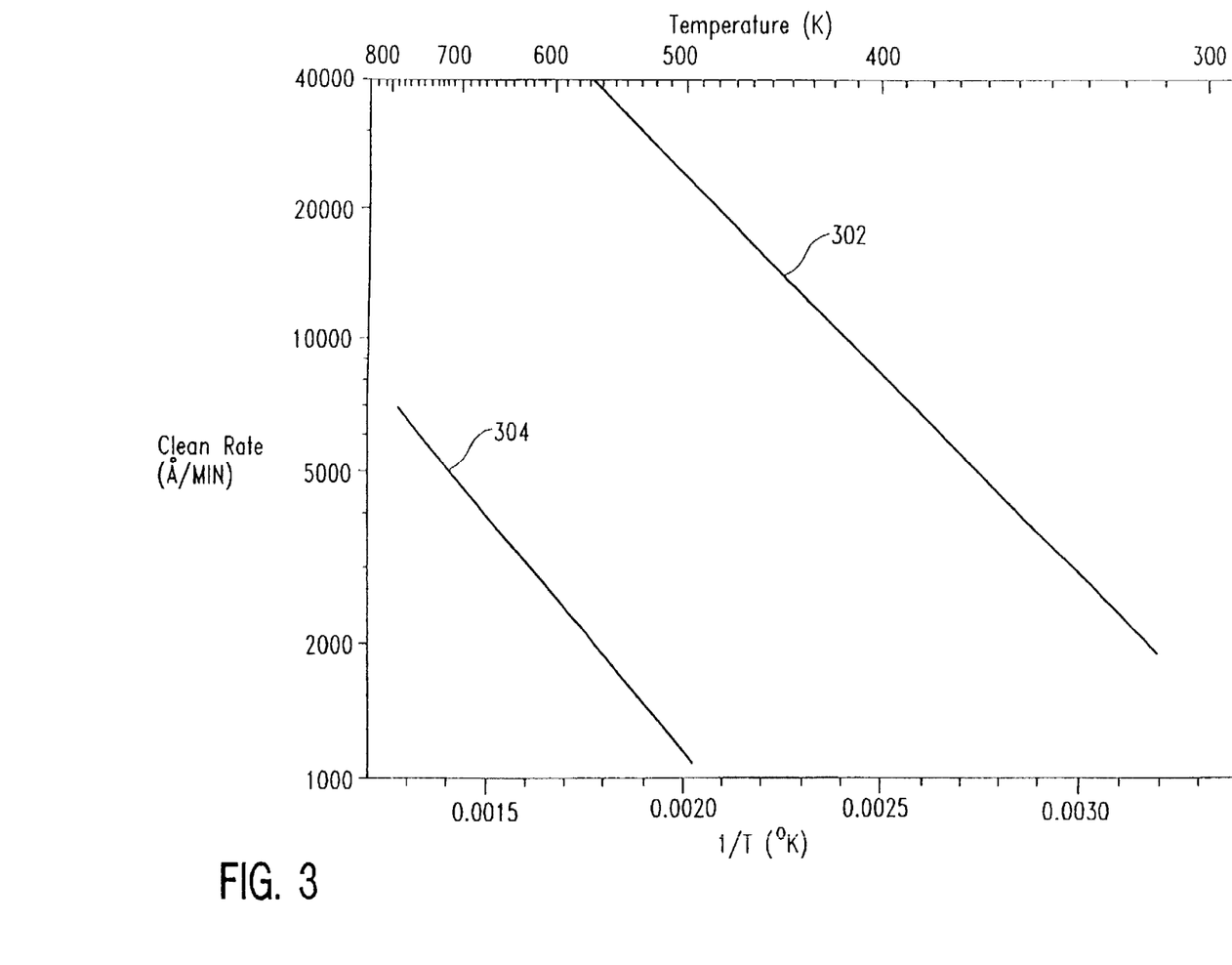
FIG. 3 is a graph showing the relationship between temperature on the surface of a temperature-controlled liner or barrier and the removal rate (cleaning rate) of a silica coating deposit from the surface of the liner or barrier.

FIG. 3 shows a graph of the cleaning or removal rate for silica depositions from a silica-coated test piece placed on a hot plate in a HDP CVD Centura® Reactor, for two different sets of process conditions. The data shows the temperature dependence relationship between the thickness of the deposit layer removed per minute and the temperature at which the cleaning process is carried out.

Under a first set of conditions, illustrated by line 302 on FIG. 3, the plasma-activated species was generated using an external 1400 W microwave source, at a pressure of about 3.8 Torr, and with gas flow rates of approximately 1000 sccm of $NF_3$ and 100 sccm of $Ar_2$. The externally-generated, plasma-activated species produced were then passed through a tetrafluoroethylene conduit to the vacuum chamber of the reactor, entering through an entry port which was located top center directly over a silica-coated (thermoxcoated) silicon wafer chip approximately 1 cm square which was attached (using a heat transfer compound) to the hot plate. The spacing between the plasma entry nozzle surface and the test piece was approximately six inches (15.2 cm).

The equation representative of the removal rate (Clean Rate) "R", illustrated by line 302, for the silica coating from the test piece surface using the externally-generated, microwave-activated species produced from $NF_3$ is:

$$R=166 e^{-2109/T} \mu/min$$

where T is in °K

Thus, in terms of cleaning rate, at about 65° C., a deposit thickness of about 0.32μ was removed per minute; at about 150° C., 1.1 μ/min was removed; at about 200° C., about 1.9 μ/min was removed; and, at about 250° C., about 2.9 μ/min was removed.

When the object is to remove all deposition materials from the surface of an aluminum alloy process chamber, production of a plasma-activated species by localized ion bombardment of $NF_3$ typically drives fluorine into the surface of the aluminum alloy as it becomes exposed. This leads to the formation of $AlF_x$. It is the $AlF_x$ which forms a wispy film that peels off in time, forcing a wet clean down of process chamber walls. The externally-generated, microwave-activated species produced from $NF_3$ enters the semiconductor processing chamber available to react with the surface of the deposits to be removed, without the above-described harmful side effects.

Under a second set of conditions, illustrated by line 304 in FIG. 3, a high density plasma-activated species was generated within the semiconductor processing chamber itself from a high density, inductively coupled plasma using RF at about 2 MHz and approximately 3500 W, at a pressure of about 3.8 Torr, and with gas flow rates of approximately 200 sccm of $C_2F_6$ and 55 sccm Of $O_2$. The removal rate (Clean Rate) "R", illustrated by line 304, for the silica deposit was:

$$R=16.1 e^{-2466/T} \mu/min$$

where T is in °K

Thus, in terms of cleaning rate, at about 250° C., a deposit thickness of about 0.14μ was removed per minute; at about 300° C., 0.22 μ/min was removed; at about 350° C., about 0.32 μ/min was removed; and, at about 400° C., about 0.429 μ/min was removed.

One skilled in the art can determine similar temperature relationships for other plasma-activated species, and the relationship can be input into the temperature controller for the temperature-controlled ceramic liner section, to achieve the appropriate cleaning rate desired for a given process chamber under the particular circumstances.

As described above, the plasma-activated species used to clean interior surfaces of semiconductor processing chambers can be generated within the chamber itself or can be externally generated. External generation not only reduces the potential for damage to the reactor chamber wall, but also makes possible multiple point introduction of the plasma within the process chamber at various locations, so the plasma can be directed toward particular process chamber surfaces which require specialized attention. Once inside the deposition chamber, the reactive species may be further excited by a local activation source, if desired.

There are also process equipment handling advantages to a remotely-generated plasma, since it is not necessary to have a bulky plasma-generation assembly attached to and disposed within the process chamber.

With regard to using multiple feed locations for the plasma-activated species generated at a remote location, FIGS. I and 2 illustrate the nozzles 124 used to feed chemical vapor deposition materials into semiconductor processing chamber 100 during the processing of a semiconductor substrate. Preferably nozzles 124 are extendable, to reduce the possibility of the build up of CVD materials on aluminum wall 101 behind temperature-controlled ceramic liner 102. Extendable nozzles 124 may also be used to feed plasma-activated cleaning species into process chamber 100 during the cleaning of temperature-controlled ceramic liner 102. Additional nozzles 123 are used to directionally feed plasma-activated cleaning species into the processing chamber 100.

Preferably, the additional nozzles 123 are extendable and rotatable to reach various heights and angles within process chamber 100, as illustrated in FIG. 1, where arrow 132 illustrates the extendibility feature and arrow 134 illustrates the rotatability feature. The means (not shown) for extending and rotating nozzles 123 is located beneath the cleaning gas (plasma-activated cleaning species) conduits 121a and 121b shown in FIG. 1. Conduits 121a and 121b each have an annular-shaped shoulder 126 disposed on their outer surface which comes to rest upon stop surface 128 when nozzle 123 is not extended. Stop surface 128 resides within an annular-shaped well 127 within the lower aluminum surface 103 of process chamber 100. An annular seal 130 between each annular shoulder 126 and stop surface 128 helps maintain the pressure difference between the deposition chamber reduced pressure and the ambient pressure outside process chamber 100.

The means for extension and rotation of conduits 121a and 121b is not illustrated herein, but one skilled in the art can obtain commercially available motor driven mechanical devices to transfer the extension and rotation motions to conduits 121a and 121b. The motor driven mechanical devices may be computer controlled, based on an algorithm which is related to the amount of deposit build up to be removed and its location within the process chamber.

Preferably the flow rate of the plasma-activated species, the temperature of the temperature-controlled ceramic liner or barrier, and the extension and rotation of the nozzles from which the plasma-activated cleaning species flow are all coordinated and computer controlled, to optimize deposit removal from the process chamber 100.

Figure 4A:
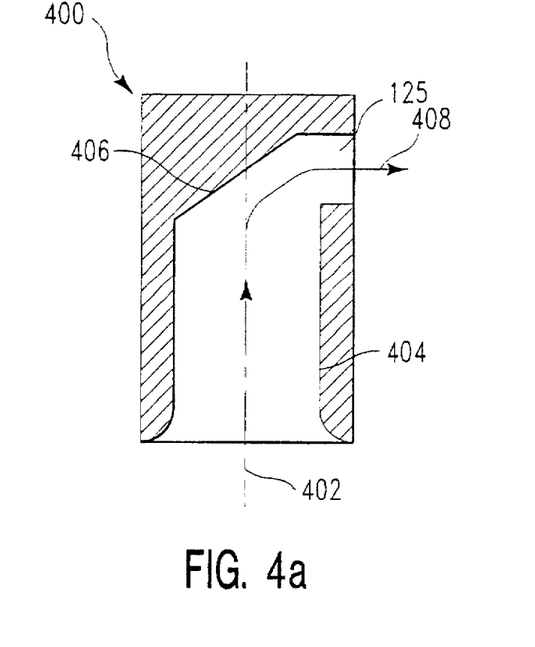
FIG. 4 illustrates a general design for plasma distribution nozzles and the conduit leading from the plasma source to the cleaning nozzles. The cleaning nozzles make it possible to direct plasma active species toward the surface which is to be cleaned. These nozzles and conduits leading to these nozzles are preferably constructed from or lined with a halogen-comprising material to avoid reduction in the active species of a plasma passing through the conduits and the nozzles.
Figure 4B:
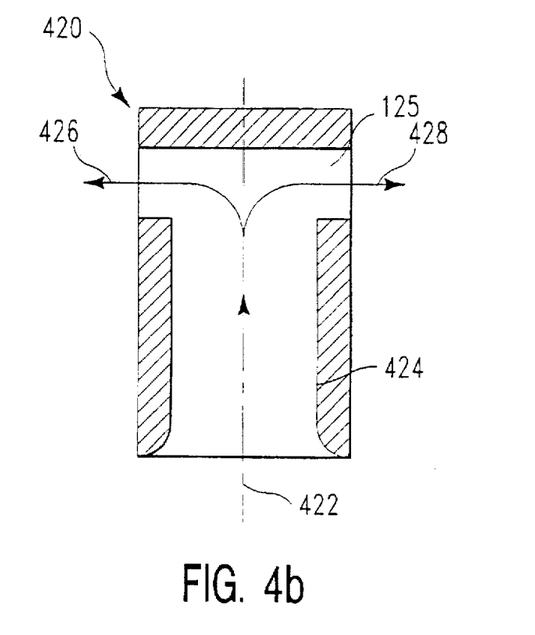

FIGS. 4a and 4b illustrate some possible nozzle designs which can be used in combination with conduits 120a and 120b which are used to feed externally-generated, plasma-activated species into the semiconductor processing chamber 100. With reference to FIG. 4a, a cleaning gas containing the active species is deflected upon deflection surface 406 which is disposed at a 45° angle with respect to the axis 402 of 15 the conduit portion 404 of nozzle 400. The cleaning gas traveling through conduit portion 404 of nozzle 400 are redirected to flow in another direction 408 which is perpendicular to deflector axis 402, as indicated by the flow arrows. In this manner, the active species can be applied and focused on those areas within the semiconductor processing chamber 100 which are normally difficult to reach. With reference to FIG. 4b, the cleaning gas traveling through conduit portion 424 of deflector nozzle 429 is redirected in two opposite directions, 426 and 428, both of which are perpendicular to the deflector nozzle axis 422. In this manner, additional areas can be simultaneously exposed to the cleaning gas and the active species contained therein.

Transportation of halogen-containing plasma-activated species through various conduits from an external generation source to the semiconductor processing chamber offers the disadvantage of the potential for deactivation of the activated species prior to their reaching the desired area within the process chamber. For example, empirical measurements have indicated that approximately 5 to 10% of the activity of externally generated, microwave-activated species produced from $NF_3$ is lost per cm of linear travel through a stainless steel conduit (tubing) having an internal diameter of about 1.5 in. (3.8 cm), at a flow rate of 1,000 sccm, at a temperature of about 50° C., and at a pressure of about 2 Torr. Similar measurements have indicated that, all else held constant, approximately 0.13% of the activity is lost per cm of linear travel, when the activated species is passed through aluminum tubing. When tetrafluoroethylene (TFE) tubing is used, only about 0.04% of the activity is lost per cm of linear travel. Thus, it is important to select the proper material for the internal surface of the conduit through which the active species travels to the semiconductor substrate processing chamber.

The above described preferred embodiments are not intended to limit the scope of the present invention, as one skilled in the art can, in view of the present disclosure expand such embodiments to correspond with the subject matter of the invention claimed below.

We claim:

1. A temperature-controlled ceramic barrier which is used adjacent to semiconductor process chamber surfaces during a plasma-comprising process, wherein said ceramic barrier temperature is controlled to reduce the formation of deposits upon, or to aid in the removal of deposits from said ceramic barrier during the processing of a semiconductor substrate within said process chamber.

2. The temperature-controlled ceramic barrier of claim 1, wherein the material of construction of said ceramic barrier is selected from the group represented by the following formula:

$$N_a Y_b$$

wherein N includes boron, aluminum, silicon, titanium, zirconium, or chromium, and Y includes oxygen, nitrogen or carbon, and wherein a is an integer of 1–2 and b is an integer of 1–3.

3. The temperature controlled barrier of claim 2, wherein said material of construction comprises a mixture of materials, each of which is represented by the given formula.

4. The temperature-controlled ceramic barrier of claim 1, wherein said barrier consists of multiple sections which have independently controllable temperature settings.

5. A temperature-controlled ceramic barrier which is used adjacent to semiconductor process chamber surfaces during the cleaning of said process chamber, subsequent to removal of semiconductor workpieces or substrates from said process chamber, wherein said ceramic barrier temperature is controlled to assist in the removal of deposits from said barrier surface.

6. The temperature-controlled ceramic barrier of claim 5, wherein the material of construction of said ceramic barrier is selected from the group represented by the following formula:

$$N_a Y_b$$

wherein N includes boron, aluminum, silicon, titanium, zirconium, or chromium, and Y includes oxygen, nitrogen or carbon, and wherein a is an integer of 1–2 and b is an integer of 1–3.

7. The temperature-controlled ceramic barrier of claim 6, wherein said material of construction comprises a mixture of materials, each of which is represented by the given formula.

8. The temperature-controlled ceramic barrier of claim 5, wherein said barrier consists of multiple sections which have independently controllable temperature settings.

9. A semiconductor processing device comprising a ceramic surface and having a means for controlling the temperature of said ceramic surface, wherein said ceramic surface temperature is controlled to reduce the formation of deposits upon, or to aid in the removal of deposits from said ceramic surface during the processing of a semiconductor substrate.

10. The semiconductor-processing device of claim 9 wherein the material of construction of said temperature-controlled ceramic surface is selected from the group represented by the following formula:

$$N_a Y_b$$

wherein N includes boron, aluminum, silicon, titanium, zirconium, or chromium, and Y includes oxygen, nitrogen or carbon, and wherein a is an integer of 1–2 and b is an integer of 1–3.

11. The temperature-controlled semiconductor-processing device of claim 10, wherein said material of construction comprises mixture of materials, each of which is represented by the given formula.

12. The temperature-controlled semiconductor-processing device of claim 9, wherein said temperature-controlled ceramic surface comprises multiple sections which have independently controllable temperature settings.

13. A semiconductor processing device comprising a ceramic surface and having a means for controlling the temperature of said ceramic surface, wherein said ceramic surface temperature is controlled during the cleaning of said semiconductor processing device to assist in the removal of deposits from said ceramic surface.

14. The semiconductor-processing device of claim 13, wherein the material of construction of said temperature-controlled ceramic surface is selected from the group represented by the following formula:

$$N_a Y_b$$

wherein N includes boron, aluminum, silicon, titanium, zirconium, or chromium, and Y includes oxygen, nitrogen or carbon and wherein a is an integer of 1–2 and b is an integer of 1–3.

15. The temperature-controlled semiconductor-processing device of claim 14, wherein said material of construction comprises a mixture of materials, each of which is represented by the given formula.

16. The temperature-controlled semiconductor-processing device of claim 13, wherein said temperature-controlled ceramic surface comprises multiple sections which have independently controllable temperature settings.

17. A method of reducing the formation of deposits upon, or aiding in the removal of deposits from a temperature-controlled ceramic barrier in a semiconductor process chamber wherein said method comprises adjusting the temperature of said temperature-controlled ceramic barrier during a plasma-assisted deposition process.

18. The method of claim 17, wherein said plasma is generated at a location remote from said process chamber.

19. A method of removing deposits from a ceramic barrier during a cleaning process within a semiconductor process chamber, wherein said method comprises adjusting the temperature of said barrier during a plasma-assisted cleaning process.

20. The method of claim 19, wherein said plasma is generated at a location remote from said process chamber.

21. A method for plasma-assisted cleaning of a semiconductor processing device comprising a ceramic surface, said method comprising:

a) providing a means for controlling the temperature of said ceramic surface; and b) controlling the temperature of said ceramic surface to assist in the removal of deposits from said ceramic surface.

22. The method of claim 21, wherein said temperature-controlled ceramic surface comprises multiple sections which are controlled to optimize contaminant removal.

23. The method of claim 22, wherein the plasma used in said plasma-assisted cleaning is generated at a location remote from said cleaning process.

24. A method for transporting a plasma-activated species from a remote location to a plasma-assisted semiconductor processing chamber in a manner which reduces the inactivation of such plasma-activated species during transport, said method comprising: passing said plasma-activated species through a conduit wherein at least the interior surface of said conduit, which contacts said plasma-activated species, is comprised of a halogen-containing material.

25. The method of claim 24, wherein a halogen present in said interior surface is selected based on compatibility with said plasma-activated species which is to be fed through said interior of said conduit.

26. A conduit suitable for transporting a plasma-activated species from a remote plasma generation source to a plasma-assisted semiconductor processing chamber in a manner which reduces the inactivation of such plasma-activated species during transport, at least an interior surface of said conduit being comprised of a halogen-containing material selected based on compatibility with an active species which is to be transported through the interior of said conduit.

27. The conduit of claim 26, wherein said plasma-activated species comprises fluorine and said conduit comprises tetrafluoroethylene.

28. The temperature-controlled ceramic barrier of claim 1, wherein said barrier is in the form of a liner.

29. The temperature-controlled ceramic barrier of claim 2, wherein said barrier is in the form of a liner.

30. The temperature-controlled ceramic barrier of claim 3, wherein said barrier is in the form of a liner.

31. The temperature-controlled ceramic barrier of claim 4, wherein said barrier is in the form of a liner.

32. The temperature-controlled ceramic barrier of claim 5, wherein said barrier is in the form of a liner.

33. A semiconductor processing device comprising a temperature-controlled ceramic surface, wherein said ceramic surface temperature is controlled to reduce the formation of deposits upon or to aid in the removal of deposits from said ceramic surface.

34. A method of removing deposits from a ceramic barrier during a cleaning process within a semiconductor process chamber, wherein said method comprises adjusting the temperature of said barrier.

35. The method of claim 34, wherein said barrier is in the form of a process chamber liner.

* * * * *